United States Patent [19]

Schwee

[11] Patent Number: 5,165,087

[45] Date of Patent: Nov. 17, 1992

[54] CROSSTIE RANDOM ACCESS MEMORY ELEMENT HAVING ASSOCIATED READ/WRITE CIRCUITRY

[75] Inventor: Leonard J. Schwee, Silver Spring, Md.

[73] Assignee: The United States of America as represented by the Secretary of the Navy, Washington, D.C.

[21] Appl. No.: 615,933

[22] Filed: Nov. 19, 1990

Related U.S. Application Data

[63] Continuation of Ser. No. 386,367, Jun. 8, 1982, abandoned.

[51] Int. Cl.$^5$ ............................................. G11C 19/08
[52] U.S. Cl. ............................................. 365/87
[58] Field of Search ....................... 365/87, 171, 172

[56] References Cited

U.S. PATENT DOCUMENTS

| | | | |
|---|---|---|---|
| 3,846,770 | 11/1974 | Schwee et al. | 365/88 |
| 3,868,659 | 2/1975 | Schwee | 365/87 |
| 3,868,660 | 2/1975 | Schwee | 365/87 |
| 4,100,609 | 7/1978 | Schwee et al. | 365/87 |
| 4,192,012 | 3/1980 | Schwee et al. | 365/87 |
| 4,231,107 | 10/1980 | Schwee et al. | 365/87 |
| 4,473,893 | 9/1984 | Zierhut et al. | 365/87 |

OTHER PUBLICATIONS

Design Electronics, vol. 8, No. 4, Jan. 1971, A. Judeinstein et al, "Magnetic thin-film memories", pp. 26-29.
L. J. Schwee et al., "The concept and initial studies of a crosstie random access memory (CRAM)," J. Appl. Phys. (vol. 53), No. 3, Mar. 1982, pp. 2762-2764.

Primary Examiner—Joseph A. Popek
Attorney, Agent, or Firm—Kenneth E. Walden; Jacob Shuster

[57] ABSTRACT

A crosstie random access memory system for reading and/or writing, utilizing permalloy thin films patterned into "wiggle" shapes to form a plurality of memory cells in an array. Address lines for reading and/or writing into the memory cells are operative through associated circuitry for writing at selected locations in the array using coincident currents. Current passed through each column of memory cells effects magnetoresistance readout in conjunction with row address lines by means of the aforementioned associated circuitry which is arranged so as to be integrated on a single substrate with the memory array.

18 Claims, 4 Drawing Sheets

CROSSTIE RANDOM ACCESS MEMORY ELEMENT HAVING ASSOCIATED READ/WRITE CIRCUITRY

BACKGROUND OF THE INVENTION

1. Field of the Invention

The present invention relates to magnetic storage devices generally, and in particular to a crosstie random access memory element and circuitry, for reading and/or writing at a particular location therein, as disclosed in my prior copending application Ser. No. 386,367 filed Jun. 8, 1982, now abandoned, with respect to which the present application is a continuation.

2. Description of the Prior Art

Electronic computers and other data processing devices, to a great extent, are limited by the speed, capacity, and reliability of their memory systems. Memory systems currently in use include tiny ring shaped ferrite cores strung on a mesh of fine wires (core memories) and semiconductor memories comprising transistor circuits laid down on tiny chips of silicon. At the present time the most common nonvolatile random access memory (RAM) in use is core memory. However, core memories having large storage capacity become bulky, heavy and extremely expensive compared to memories which can be fabricated using photolithographic techniques such as the aforementioned semiconductor memories. Unfortunately, for the most part, dense and light weight semiconductor memories are volatile. The exception is MNOS semiconductor memories which take a relative long time to write and read and have limited retentivity. Consequently, there is a need in the prior art to configure by use of photolithographic techniques a nonvolate random access memory in association with read/write circuitry, which is fast, but light in weight and low in cost In the prior art, as an alternative to the foregoing memories data bits are stored in the form of magnetic bubbles which move in thin films of magnetic material. These magnetic bubbles are actually cylindrical magnetic domains whose polarization is opposite to that of the thin magnetic film in which they are embedded. The magnetic bubbles are stable a considerable range of conditions and can be moved from point to point at high velocity. Magnetic bubble memories are substantially cheaper than the core memories aforementioned, and much faster than magnetic disk memory systems which are widely used for high capacity storage. Magnetic bubble memories are analogous to magnetic disk memories in that both systems store data as states on, or in, a thin magnetic film. In a disk memory, the film is moved mechanically at high speeds while in a magnetic bubble memory, the magnetic bubbles move at high speeds throughout the thin magnetic film. Since magnetic bubble memories are nonvolatile logical operations can be performed without reading or writing the stored data out/in again so that magnetic bubble memories do not have moving parts and therefore may operate reliably for long periods of time. However, a drawback of magnetic bubble memory devices is that single crystals with minimal defects are required for fabrication. Moreover, it is difficult to produce large single crystals for high storage devices. Even the attempted use of amorphous materials does not eliminate the problem of high eddy currents which reduce the speed of the magnetic bubble domains. Even so, magnetic bubble memories have many advantages. Nevertheless, there is a need in the prior art to configure a nonvolatile random access memory using thin magnetic film technology and yet provide rapid access time while utilizing only polycrystalline material.

As further background, the present invention is an out growth of the crosstie memory technology disclosed primarily in U.S. Pats.: 3,846,770 to Schwee et al., entitled "Serial Access Memory Using Magnetic Domains in Thin Film Strips," filed Jul. 11, 1973, patented Nov. 5, 1974; 3,868,659 to Schwee, entitled "Serial Access Memory Using Thin Magnetic Films," filed Apr. 10, 1973, patented Feb. 25, 1975; 3,868,660 to Schwee, entitled "Detector for Cross-tie Memory," filed Apr. 10, 1973, patented Feb. 25, 1975; 4,100,609 to Schwee, et al., entitled "Magnetoresistance Detector for Crosstie Memories," filed Sept. 3, 1976, patented Jul. 11, 1978; 4,192,012 to Schwee et al., entitled "Crosstie Memory Bit Stretcher Detector," filed Nov. 8, 1978, patented Mar. 4, 1980; and 4,231,107 to Schwee et al., entitled "Serriform Strip Crosstie Memory," filed Feb. 14, 1978, patented Oct. 28, 1980, all patents being assigned to the same assignee as the present invention.

Briefly, Schwee et al., '770 disclose a polycrystalline thin film strip for storing digital information serially in the form of reversal domains. The reversal domains are propagat along the thin film strip, e.g., of permalloy, and then sensed to detect the stored digital information.

Schwee, '659, discloses a serial access memory based the propagation of crosstie walls and Bloch lines along domain walls in thin magnetic films. Variation of the current through conductors placed above the domain walls changes the fields along the walls causing the relocation of Bloch lines and crossties in the walls which causes propagation of the information contained in inverted Néel walls along the domain walls.

Schwee et al., '107, discloses a crosstie memory using a plurality of permalloy thin film strips of uniform thickness each strip having parallel denticulated margins etched to align with the oblong axis thereof. Each pair of opposite denticles defines a distinct memory cell.

The other Patents listed above are cited to show additional prior art of crosstie memory development, and the development of certain types of detectors for use therewith. All of the listed patents are incorporated herein by reference.

The cited and discussed Patents do disclose certain versions and particular aspects of crosstie memories. But they do not disclose or teach, inter alia, the placing of magnetic domain walls into a matrix or array configuration using "wiggle" patterns thereby creating a random access memory element (memory array). Nor do the Patents teach a scheme to read and/or write in this memory array.

The prior art, as indicated hereinabove, teach some advances in crosstie memories including devices for detecting or reading-out binary information therefrom. However, insofar as can be determined, no prior art device or process incorporates the features and advantages of the present invention.

OBJECTS OF THE INVENTION

Accordingly, a principal object of the present invention is to configure a nonvolatile random memory element and associated read and/or write circuitry so as to be substantially faster and lighter in weight than present nonvolatile random access memories, but yet be lower in cost and have high bit density.

A corollary object of the above principal object is to configure the nonvolatile random access memory element using thin magnetic film and photolithographic techniques, but yet be faster in access time than magnetic bubble memories while requiring only polycrystalline material for the fabrication thereof.

Another object of the present invention is to configure a nonvolatile random memory element on a silicon substrate so as to be compatible with present day integrated circuit fabrication.

A corollary object of the above object is to configure the nonvolatile random access memory element so that a significant number of its masking levels can be folded in with the masking levels needed to connect transistors for encoding and decoding thereof.

Yet another object of the present invention is to configure the nonvolatile random access memory element to have non-destructive readout, but yet be low in cost.

Still another object of the present invention is to configure the nonvolatile random access memory element to have high bit density, but yet not generate excessive heat thereby eliminating the need for elaborate heat sinking.

A further object of the present invention is to configure the nonvolatile random access memory element to be resistant to radiation, but still be fast and low in cost.

SUMMARY OF THE INVENTION

In accordance with the foregoing stated objects, the present invention has as a primary purpose the fabrication of a nonvolatile random memory element and associated read and/or write circuitry having a high bit density that is fast and low in cost for use in computers, or with microprocessors and signal processors.

The essence of the present invention is in the use of permalloy thin films, inter alia, to configure the nonvolatile random memory element by placing and forming magnetic domain walls (Néel walls) in the permalloy establishing a matrix or array configuration. The matrix or array configuration makes it possible to address a particular memory cell by activating only two lines. In the case of writing, a juxtaposed meandering column conductor and a juxtaposed row conductor are used. In the case of reading, a juxtaposed column of memory cells (comprising the "wiggle" pattern) and a juxtaposed row conductor are used. This simplifies the circuitry needed for the read and write operations. The circuitry for read and write operations is arranged so that functional subsystems thereof can be integrated on a single substrate with the memory.

The purpose of the present invention is carried out by depositing a first level of permalloy of 81-19 Ni-Fe onto a glass substrate or onto the oxide layer of a silicon substrate. The permalloy film is then etched into a plurality of juxtaposed columns of memory cells to form a matrix or array thereof. The plurality of juxtaposed columns of memory cells (memory cell array) are each configured into a unique "wiggle" pattern in each memory cell after a predetermined magnetic field is applied along the hard axis of the memory cell array and then reduced to zero. In this way, the magnetization is aligned properly for use of the memory cell array as a nonvolatile random access memory element. Each memory cell in the array is connected so that current can be passed through each column of the array for magnetoresistance readout. A second level comprises an insulator of silicon nitride or silicon monoxide having vias for connection to the permalloy columns of the array. A third level of 95-5 Al-Cu is deposited so as to fabricate a plurality of juxtaposed row conductors perpendicular to the permalloy columns of the array but above corresponding memory cells of the columns. These conductors form row address lines for reading/writing operations. A fourth level comprises another insulator layer having vias for connection to individual row address lines. A fifth level of 95-5 Al-Cu is deposited so as to fabricate a plurality of column conductors which "meander" above corresponding columns of the array traversing each memory cell therein in the same direction. These conductors form column address lines for the writing operation since writing is accomplished using coincident currents.

BRIEF DESCRIPTION OF THE DRAWINGS

The foregoing and other objects, novel features and advantages of the present invention will be more apparent from the following more particular description of the preferred embodiments as illustrated in the accompanying drawings, in which.

DESCRIPTION OF THE PREFERRED EMBODIMENTS

The following is a description of a crosstie random access memory element employing the present invention. A description of a process for fabricating the crosstie random access memory element, is also discussed in some detail.

Figure 1:
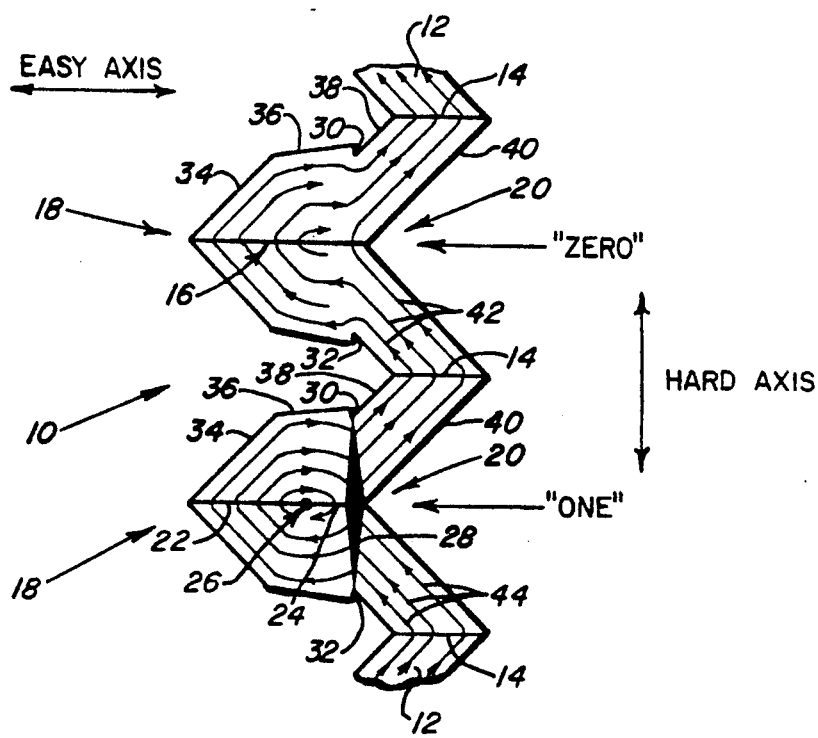
FIG. 1 depicts a unique "wiggle" pattern shape of a memory cell(s), and illustrates the directions of magnetization for a logic "zero" and a logic "one", according to the present invention.

Referring initially to FIG. 1, the configuration of a plurality of memory cells 10, of a polycrystalline magnetic material such as a permalloy thin film 12, is illustrated. Also illustrated, is the direction of magnetization for a logic "zero" and a logic "one" within the respective memory cells 10. Each one of memory cells 10 is juxtaposed between adjacent ones of a plurality of 90° unipolar Néel walls 14. The etching of permalloy thin film 12 into a "wiggle" pattern of connected memory cells 10 is an important contribution of the present invention. The one of the memory cells 10 containing the logic "zero" condition includes a unipolar Néel wall 16 parallel to the easy axis and extending between one of a plurality of outside apexes 18 and a corresponding one of a plurality of inside apexes 20. The one of memory cells 10 containing the logic "one" includes a positive Néel wall portion 22 and a negative Néel wall portion 24 both being parallel to the easy axis. Positive Néel wall portion 22 extends between another one of outside apexes 18 and a Bloch line 26 which is a line of magnetic flux extending perpendicular to the plane of permalloy thin film 12. Negative Néel wall 24 extends between the aforementioned Bloch line 26 and a corresponding one of inside apexes 20. In this one of memory cells 10, a crosstie 28 extends between one of a plurality of top glitches of permalloy 30 and a corresponding one of a plurality of bottom glitches of permalloy 32.

Still referring to FIG. 1, the "wiggle" pattern is further formed by etching permalloy thin film 12 to include a plurality of top acute edges of permalloy 34 each joined to corresponding ones of a plurality of substantially parallel to the easy axis top edges of permalloy 36 which, in turn, join corresponding ones of the aforementioned top glitches of permalloy 30. Each one of a plurality of top short edges of permalloy 38 extends acutely from corresponding ones soft top glitches of permalloy 30 to the beginning of corresponding ones of 90° Néel walls 14. Each one of a plurality of top long edges of permalloy 40 extends down acutely from the end of corresponding ones of 90° Néel walls 14, aforemen corresponding ones of inside apexes 20. This completes the description of the top half of a particular one of plurality of memory cells 10. But as shown, the bottom half of a corresponding memory cell is the mirror image of the top half thereof as mirrored about, for the example of the memory cell containing a logic "zero", unipolar Néel wall 16. The foregoing condition of configuration is correct for all of memory cells 10, and, accordingly, for clarity in FIG. 1, the mirrored images, except where already noted, are not numbered.

As further illustrated in FIG. 1, when a positive magnetic field of about 100 Oe is applied along the hard axes in the plane of permalloy thin film 12 in an upward direction) and then reduced to zero, the magnetization as depicted by vectors 42, is properly aligned for use of the cells as a memory, and a logic "zero" will be present in all of memory cells 10. The magnetization alignment is shown in the top memory cell as aforementioned. The magnetization aligns itself parallel to the edges of the shape of permalloy thin film 12 to decrease magnetostatic energy. The edges influence the magnetization direction for several microns from each edge. The distance between memory cells 10 is about 20 microns. Now if a negative field of about 11 Oe is applied along the hard axis in the plane of permalloy thin film 12 (in a downward direction), and then reduced to zero, a crosstie will appear in all of plurality of memory cells 10. This magnetization, as depicted, inter alia, by vectors 44, is shown in the bottom memory cell as aforementioned. Consequently, the presence of a crosstie 28 and a Bloch line 26 pair is considered a logic "one" and the absence thereof a logic "zero". It should be mentioned that the magnetization directions as represented by vectors 42 and 44 remain parallel and in the same directions along the edges of the respective memory cells, whether a logic "one" or a logic "zero" is present. The predictable behavior of any one of memory cells 10 is predicated on the foregoing facts.

To eliminate the crosstie Bloch line pair, a positive field of above 15 Oe is required. As the field is applied, the Bloch line approaches the crosstie, by which it is repulsed, until contact is made and annihilation occurs. Then the field can be returned to zero and a "zero" will be present. At zero applied field a logic "one" or logic "zero" is stable.

Figure 2:
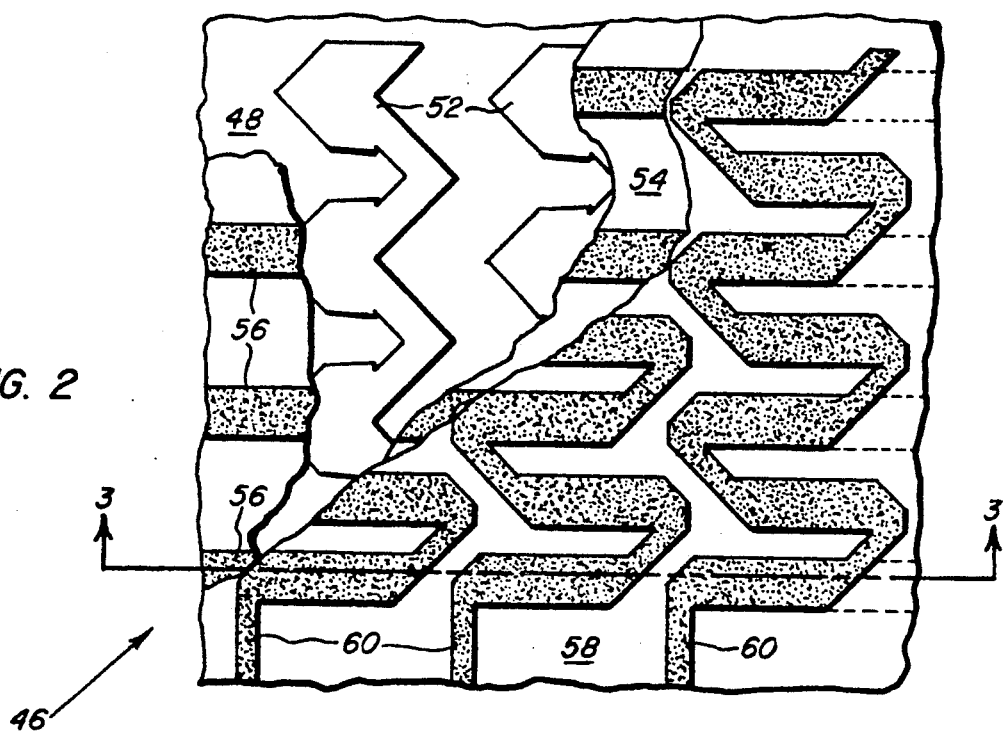
FIG. 2 is a top plan view of a crosstie random access memory element including, inter alia, an array of the memory cells of FIG. 1, a level of row conductors and a level of "meandering" column conductors.
Figure 3:
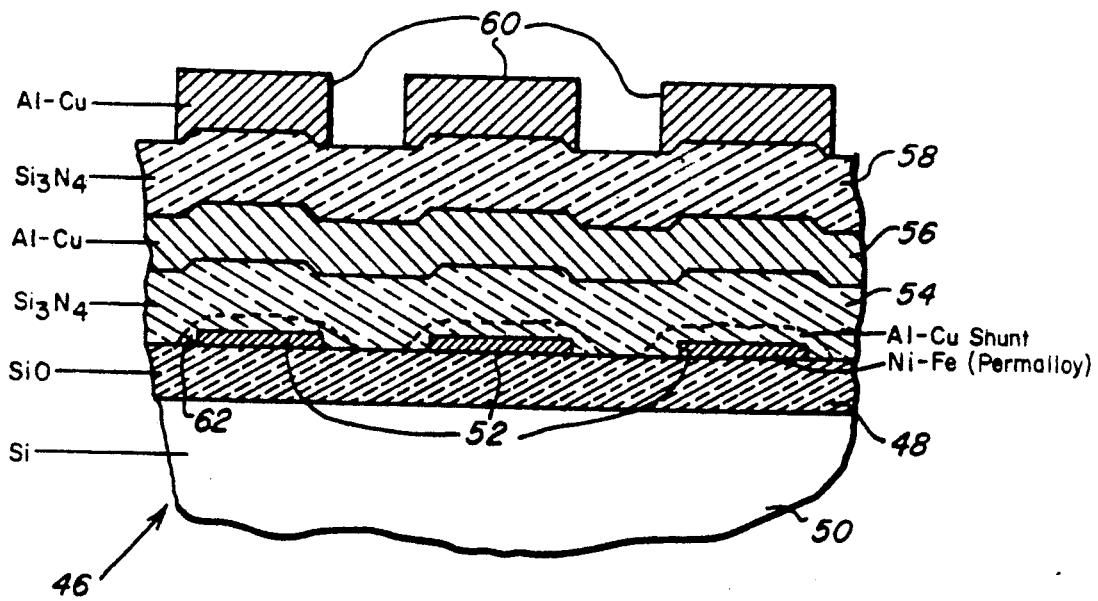
FIG. 3 is a sectional view depicting additional levels of fabrication of the crosstie random access memory element of FIG. 2 taken along lines 3—3 thereof.

Referring now to FIGS. 2 and 3 concurrently, a plan view of a preferred arrangement of a crosstie random access memory element 46 suitable for read and write operations along with a sectional view thereof are shown. A first level of memory element 46 is deposited on a suitable substrate comprising a silicon oxide layer 48 which has been grown on a silicon substrate 50 or on a glass substrate (not shown). This first level comprises a plurality of juxtaposed columns of memory cells 52 composed of memory cells 10 of permalloy thin film 12 (see FIG. 1). For purposes of illustration only, an array of three columns 52 each having four memory cells 10 are shown. This first level of memory element 46 is fabricated by first depositing 81-19 Ni-Fe using a physical vapor deposition process (either resistance heating or electron beam heating) or a sputtering process. This layer is patterned with the unique "wiggle" pattern using conventional photolithgraphic techniques and then etched chemically or with an ion beam miller. A second level of memory element 46 comprises an insulator layer 54 of silicon nitride or silicon monoxide having vias (not shown) for making connections to juxtaposed columns of memory cells 52. The vias in this level are created using a liftoff technique whereby photoresist plugs are removed in a heated acetone bath agitated with an ultrasonic agitator. This technique is believed to give superior stripping of the photoresist. A third level comprises a plurality of juxtaposed rows of conductors 56 of 95-5 Al-Cu. The conductors 56 are fabricated to traverse adjacent and corresponding memory cells 10 of juxtaposed columns of memory cells 52 so as to be perpendicular to the juxtaposed columns. These conductors form the row read/write address lines for memory element 46. This level is fabricated using a liftoff process also. The pattern created is such that only areas of this level which are not to have Al-Cu on them are covered with photoresist and all other areas are left clear. The Al-Cu is then deposited in an ion beam coater. Then the metallization pattern is created by removing the photoresist on the areas intended to be free of metal by also using heated acetone in an ultrasonic agitator. A fourth level of memory element 46 comprises an insulator layer 58 also of silicon nitride or silicon monoxide and also having vias (not shown) for connection individually to the juxtaposed rows of conductors 56. This processing step is substantially the same as fabrication of level two. A fifth level comprises a plurality of juxtaposed meandering columns of conductors 60 also of 95-5 Al-Cu. The conductors 60 are fabricated to traverse corresponding ones of juxtaposed columns of memory cells 52 meandering up each column crossing above each memory cell 10 thereof in the same direction. This processing step is substantially the same as fabrication of level three. These meandering conductors form the column write address lines for memory element 46.

For purposes of the present invention, silicon oxide layer 48 is about 2000 Å thick, the first level of juxtaposed columns of memory cells 52 is about 400 Å, the second level of insulator layer 54 is about 2000 Å, the third level of juxtaposed rows of conductors 56 is about 1000 Å, the fourth level of insulator layer 58 is about 2000 Å, and the fifth level of juxtaposed meandering columns of conductors 60 is about 3000 Å. Note that these meandering column conductors are deposited about 2000 Å thicker than the row conductors to compensate for the increase in resistance due to the longer meandering current path required.

Figure 4:
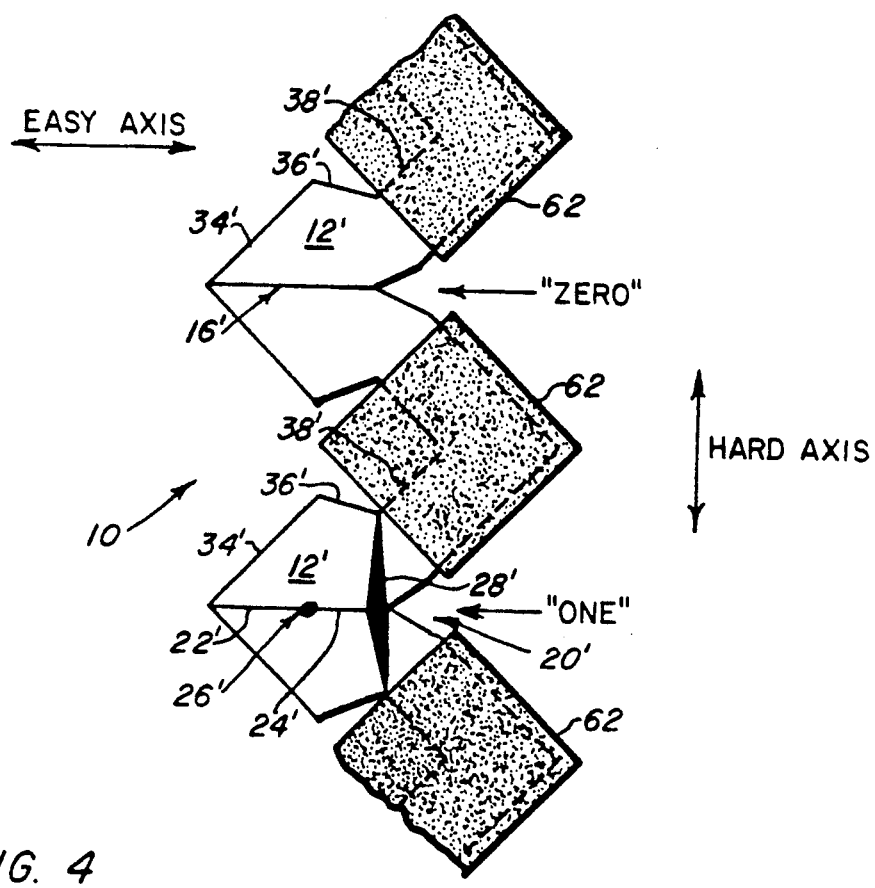
FIG. 4 depicts another embodiment of the memory cells of FIG. 1 and the placement of current shunts therebetween which are shown also in the sectional view of FIG. 3.

FIG. 4 depicts an improved shape when compared to the embodiment of FIG. 1. The plurality of top and bottom glitches 30 and 32 have been eliminated as shown in FIG. 4. In order to predictably locate crosstie 28', the plurality of top acute edges of permalloy 34' are extended further than their counterparts in FIG. 1. Also, edges of permalloy 36' are no longer substantially parallel to the easy axis, but each edge forms a definitive angle therewith and is shorter than its counterpart. The shape changes tend to localize crosstie 28' at the transition part of corresponding top and bottom edges 36' and 38' and at inside apex 20' as shown. The foregoing configuration keeps Bloch line 26' farther removed from crosstie 28' thereby providing a more stable memory cell.

Still referring to FIG. 4 and again to FIG. 3, as viewed concurrently, a plurality of current shunts 62 of 95-5 Al-Cu having a thickness of about 1500 Å are disposed between adjacent ones of memory cells 10' on permalloy thin film 12'. Permalloy thin film 12' need not be continuous under plurality of current shunts 62. This process step, performed after deposition of the first level of juxtaposed columns of memory cells 52, decreases the resistance of a column of memory cells 52 by about 50%. This process step is accomplished by another liftoff process whereby photoresist covers all areas except where the Al-Cu current shunts are to be fabricated. Then an Al-Cu layer is deposited over the entire surface. Finally, the pattern is defined by stripping the photoresist using the heated acetone bath with the ultrasonic agitator aforementioned. Also, the signal to noise ratio and power dissipation are improved by this step and the previously mentioned shape change. The desired properties of magnetic materials suitable for use with the present invention are zero magnetostriction, $H_k \sim 3.5$ Oe, $H_c \sim 1$ to 1.5 Oe, and the magnetostriction ratio, $\Delta R/R''$, greater than 2.3%. Isotropic films may also be used in the fabrication of the present invention.

STATEMENT OF THE OPERATION

Details of the operation, according to the preferred embodiment of the present invention, are explained in conjunction with FIG. 2, FIGS. 5a–5d, and FIG. 6.

Referring again then to FIG. 2, a writing operation is accomplished using coincident currents. For example, if a logic "zero" is to be written in a particular one of memory cells 10 of a particular one of juxtaposed columns of memory cells 52, a current is sent through the juxtaposed row conductor (row read/write address line) 56 above the location of the particular one of memory cells 10. In addition, a current is sent through the juxtaposed meandering column conductor (column write address line) 60 which crosses that location of the particular one of memory cells 10. Only at that location do the magnetic fields, due to the aforementioned currents, add up to a sufficient field amplitude to annihilate a crosstie Bloch line pair. To write a logic "one", the same method is used but the currents are reversed, and are smaller in amplitude. About negative 7 mA in each conductor is needed to write a logic "one" and about plus 15 mA in each conductor is needed to write a logic "zero".

In the worst case situation considering the time needed to set gates or decoders, the write time will be about 80 nsec. also, in the worst case situation regarding fabrication and the geometry of memory element 46, the largest currents needed to write will be about 15 mA.

As previously stated, the magnetoresistance effect is used for readout. In FIGS. 5a–5d, four situation are illustrated showing the direction of magnetization for a memory cell 10 containing a logic "zero" with no applied field; a logic "one" with no applied field, and a logic "one" with applied field, respectively. As shown in FIG. 5d, the applied field is large enough to bring Bloch line 26 close to crosstie 28 but not large enough for annihilation. The applied field described here is about 60% of the required annihilation field. This field is applied using juxtaposed rows of conductors (row read/write address lines) 56, aforementioned in the writing operation. Note that the same applitude can be used for the writing operation.

Figures 5A, 5B:
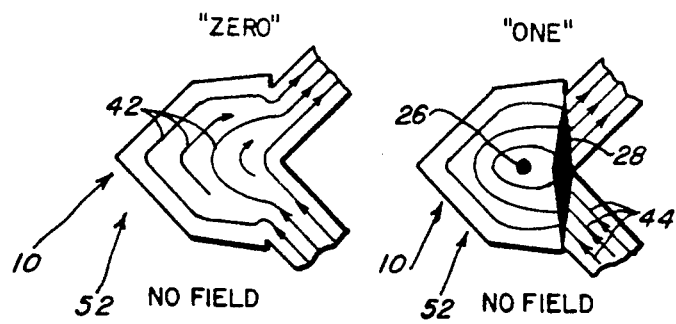
FIGS. 5a-5d illustrate the magnetization directions in a memory cell for a logic "zero" and a logic "one" with and without a locally applied field, according to the present invention.
Figures 5C, 5D:
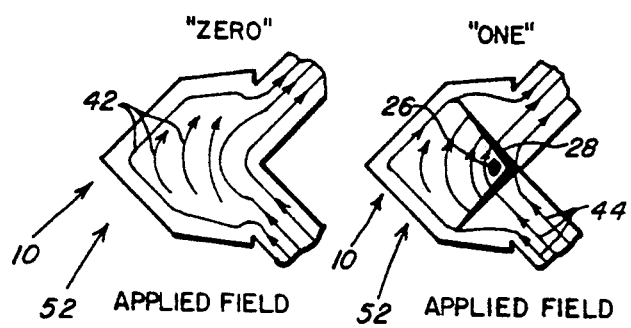

A particular change in resistance can be expected from each memory cell 10. This resistance is given by the equation $$R = R_o + (\Delta R/2) \cos 2 \, \Gamma,$$

where $\theta$ is the angle between the direction of current flow and the magnetization direction as represented by vectors 42 for the logic "zero" condition of FIGS. 5a and 5c, and as represented by vectors 44 for the logic "one" condition of FIG. 5b and 5d, $\Delta R$ is about 3% of the resistance $R_o$, and $R_o$ in permalloy thin films 400 Å thick is about 6$\Omega$/sq. The current path through a juxtaposed column of memory cells 52, and accordingly memory cells 10 will closely follow the magnetization directions as represented by vectors 42 in FIG. 5c. This is then a high resistance situation with $\theta$ nearly zero everywhere in memory cells 10. When a field is applied to a logic "zero" condition, there is a slight increase in resistance. On the other hand, when a logic "one" is present and no field applied (FIG. 5b), the current encounters an area where the magnetization, as represented by vectors 44, is oriented at nearly 90° from the current path. This occurs where the current is most concentrated near the corner because of the sharp bend. The logic "one" with no field applied is then a low resistance situation. When a local field is applied to a logic "one" (FIG. 5d), the magnetization as represented by vectors 44, aligns itself in nearly the same direction as is seen for a logic "zero" with an applied field (FIG. 5c). This is a high resistance situation. Therefore, the resistance increases more for a logic "one" situation than for a logic "zero" situation when a field is applied.

Figure 6:
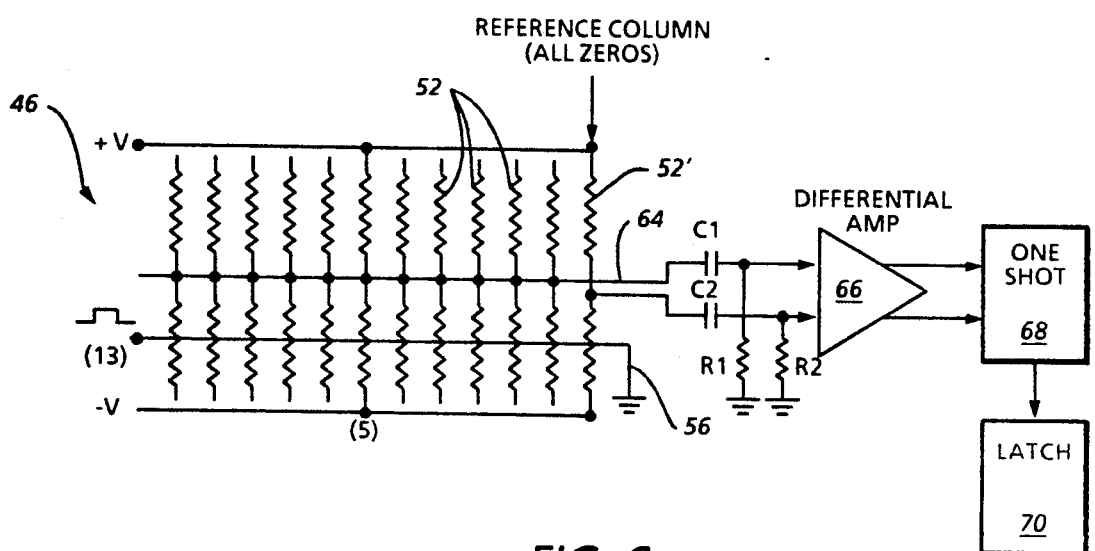
FIG. 6 shows a circuit configuration for readout of a memory cell and illustrates a readout method using, inter alia, a reference column and a selected column and row, according to the present invention.

A preferred scheme for reading is shown in FIG. 6 wherein all of the wiggle patterns comprising juxtaposed columns of memory cells 52 are connected via a common address select line 64 to one input of a differential amplifier 66 via a differentiator $C_1 R_1$ except for juxtaposed column of memory cells 52' which is used for a reference column and is connected to the other input of differential amplifier 66 via a differentiator $C_2 R_2$. In a reading operation, juxtaposed columns of memory cells 52 and juxtaposed rows of conductors 56 are energized. Juxtaposed meandering columns of conductors 60 (not shown in FIG. 6) are not used in the reading operation.

Continuing and still referring to FIG. 6, row (13) and column (5) of juxtaposed rows of conductors 56 and juxtaposed columns of memory cells 52, respectively, are selected for illustration. All other columns are disconnected as shown, using for example tri-state circuits (not shown). A pulse is sent through the selected row (13). If a logic "zero" is present at location row (13), column (5) in the corresponding memory cell 10 (FIG. 1) thereat, identical signals are received at each input of differential amplifier 66. Accordingly, because of the differential input there is no change in the output of differential amplifier 66. If, however, a logic "one" is present at row (13), column (5), a difference signal, the difference between a logic "zero" and a logic "one", is generated with amplication at the output of differential amplifier 66. Sufficient amplitude is provided to trigger a bidirectional one shot 68 having a comparator or threshold type input. Thus, a signal above a particular preset reference level is considered a logic "one", and a signal below this reference level is considered a logic "zero". The resulting signal (bit) can next be stored in a latch 70 for subsequent readout.

The purpose of the reference column 52' is to eliminate or reduce common mode signals and to decrease the time required for differential amplifier 66 to settle down once a row and column are selected. Also, the use of reference column 52' eliminates an output from differential amplifier 66 if a logic "zero" is being detected. This approach simplifies later decision making with one shot 68 and latch 70. On the other hand, the reference input to differential amplifier 66 could be grounded, and the threshold of the one shot 68 can be set higher to compensate for this change.

Figure 7:
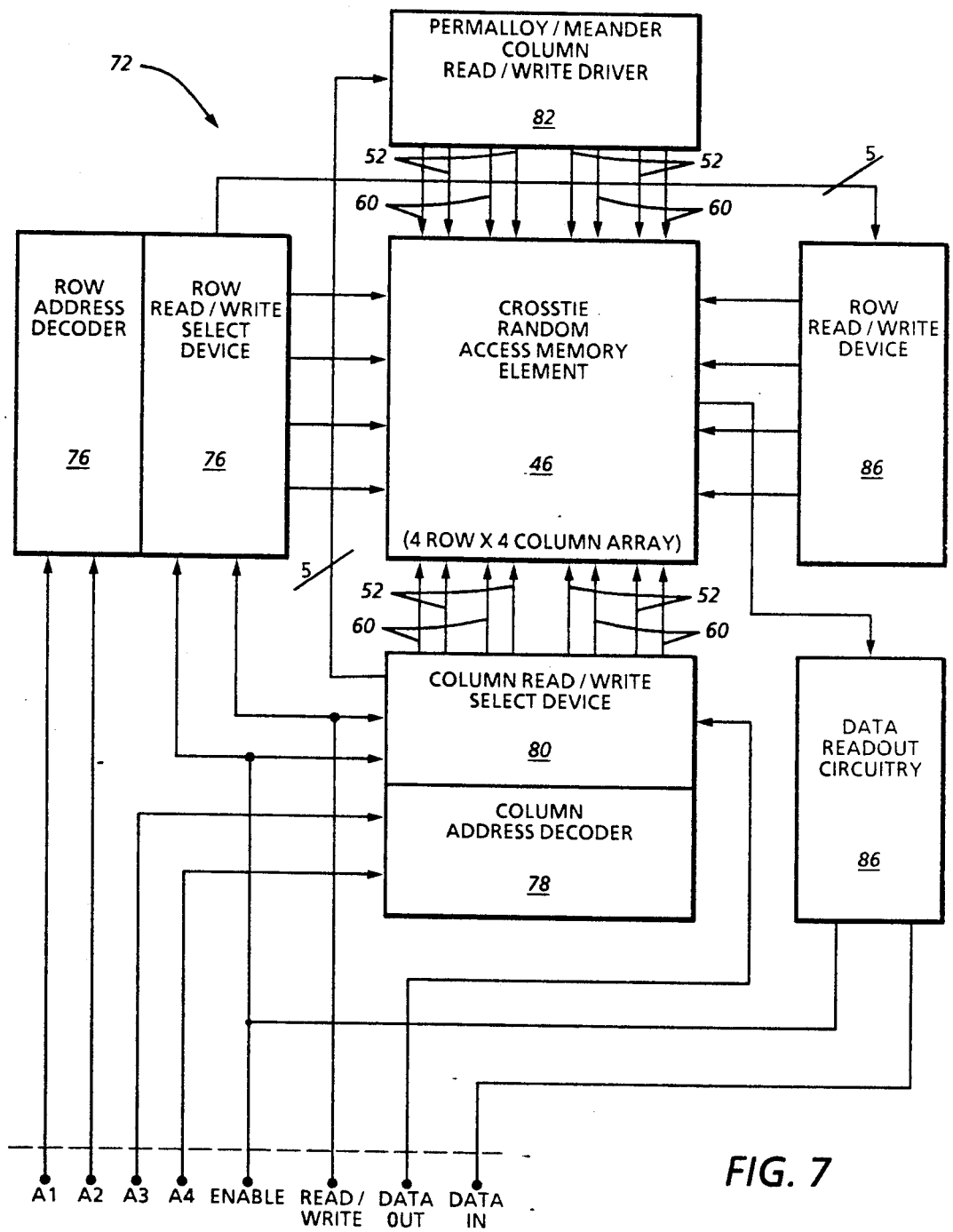
FIG. 7 is an arrangement of a crosstie random access memory system, including the memory element of FIG. 2 and associated functional subsystems for writing data in and reading data out of the memory element, according to the present invention.

FIG. 7 shows a crosstie random access memory system 72 for writing data in and reading data out of a crosstie random access memory element 46, having, for example, four rows and four columns giving a bit capacity of sixteen, which is tantamount to the number of memory cells 10 therein (see FIG. 2). This arrangement is predicated on the fact that the functional subsystems shown can be integrated on a single silicon substrate and that a significant number of the masking levels for fabricating memory element 46 can be folded in with the masking levels needed for connection of the subsystems to each other and to memory element 46.

In operation, an address is set by selecting a particular location in memory element 46 where a logic "zero" or a logic "one" is stored. Thus, addresses $A_1$, $A_2$, $A_3$ or $A_4$ will be set to a "high" or "low" level, depending on which location in memory element 46 is to be accessed. Memory element 46 also has to know whether a logic "zero" or a logic "one" is to be written. Thus, the Data In line has to be set to a "high" or "low" level, respectively. Also, memory element 46 has to be instructed as to whether a read or write operation is to be performed. Hence, the Read/Write line has to be set to a "high" level for a read operation and to a "low" level for a write operation.

Assume now a write operation. Accordingly, the Read/Write line is set for a "low" level, the address is selected, a "high" or "low" level is set at the Data In line, and then the Enable line is set to a "high" level long enough for the write operation to take place (about 50 nanoseconds). A row address decoder 74 cooperates with a row read/write select device 76 and a row read/write driver 84 so as to select a particular one of juxtaposed rows of conductors (row read/write address lines) 56 of memory element 46 based on the address information on address lines $A_1$ and $A_2$. Row read/write select device 76 operates such that if a logic "zero" is to be written, a positive polarity current of about 15 mA drives the particular one of row address lines 56 selected. On the other hand, if a logic "one" is to be written, a negative polarity current of about 7 mA is provided. Likewise, a column address decoder 78 cooperates with a column read/write select device 80 and a permalloy meander column read/write driver 82 so as to select a particular one of juxtaposed meandering columns of conductors (meandering column write address liens) 60 of memory element 46 according to the address information on address lines $A_3$ and $A_4$. Accordingly, for a write operation, a particular one of meandering column write address lines 60 is selected, not one of juxtaposed columns of memory cells (permalloy columns) 52. Column read/write select device 80 operates such that if a logic "zero" is to be written, a positive polarity current of about 15 mA drives the particular one of meandering column write address lines 60 selected. On the other hand, if a logic "one" is to be written, a negative polarity current of about 7 mA is provided. As previously stated, a writing operation is accomplished using coincident currents, and the polarity and amplitude of the currents depend on whether a logic "zero" or a logic "one" is being written. Thus, row read/write select device 76 drives a particular one of row read/write address lines 56 as determined by row address decoder 74. Row read/write select device 76 changes the polarity and amplitude of the signal at its output depending on whether a logic "zero" or logic "one" is to be written in a memory cell 10 (FIG. 1) of memory element 46. Likewise, column address decoder 78 and column read/write select device 80 coact in the same fashion to drive a particular one of column write address lines 52. It should be noted that memory element 46 can be configured so that the opposites of the foregoing current polarities and amplitudes are needed for proper operation.

Assume now a read operation. The Read/Write line is set to a "high" level, the address is entered, and, finally, the Enable line is set to a "high" level. Immediately, column read/write select device 80 cooperates with permalloy/meander column read/write driver 82 to enable current flow through the selected one of permalloy columns 52. After a delay long enough for a data readout circuitry 86 to reference itself, a row pulse (FIG. 6) is applied through the selected one of row read/write address lines 56 of the same amplitude and polarity as was used to write a logic "zero" so as to modify the current flow in the selected one of the permalloy columns 52 by changing the resistance in the particular memory cell 10 (FIG. 10) that is being read. After another delay, the currents in the selected one of row read/write address lines 56 and selected one of permalloy columns 52 are shut off. At this point in time, read operation is completed and the data, via common address select line 64 and data readout circuitry 86 is present at the Data Out line (see FIG. 6). This gives a non-destructive read time of 100 to 500 nanoseconds.

To these skilled in the art, many modifications and variations of the present invention are possible in light of the above teachings. It is therefore to be understood that the present invention can be practiced otherwise than as specifically described herein and still be within the spirit and scope of the appended claims.

What is claimed is:

1. A crosstie random access memory system having the capability of writing data in and non-destructively reading data out, comprising:

a memory element including a plurality of juxtaposed columns of memory cells arranged in an array having a plurality of juxtaposed rows of conductors operatively connected to the plurality of juxtaposed columns of memory cells perpendicular thereto, and a plurality of juxtaposed meandering columns of conductors operatively connected to said plurality of juxtaposed columns of memory cells perpendicular to said plurality of juxtaposed rows of conductors, for writing and reading out of memory cells of said juxtaposed columns of memory cells logic "ones" and logic "zeros", wherein the presence of a crosstie Bloch line pair in a memory cell corresponds to a logic "one" and the absence thereof a logic "zero";

row means operatively connected to said plurality of juxtaposed rows of conductors for selecting and driving a particular one thereof during a write or read operation based on predetermined address, enable and read/write information on lines connected to said row means:

column means operatively connected to said plurality of juxtaposed meandering columns of conductors and said plurality of juxtaposed columns of memory cells for selecting and driving a particular one of said juxtaposed meandering columns of conductors during the write operation, and for selecting and driving a particular one of said plurality juxtaposed column of memory cells during the read operation based on predetermined address, enable, read/write and data information on lines connected to said column means; said row means and said column means cooperating during the write operation to generate coincident drive currents, the polarities and amplitudes of the drive currents depending on whether a logic "zero" or a logic "one" is being written, and said row means and said column means cooperating during the read operation to modify the drive current through said particular one of said plurality of juxtaposed columns of memory cells by applying a pulse of a predetermined level to said particular one of said plurality of juxtaposed rows of conductors so as to change the resistance of the memory cell thereof being read; and data readout circuitry having an input and an output, the input being operatively connected to said plurality of juxtaposed columns of memory cells of said memory element such that when said particular one of said plurality of juxtaposed columns of memory cells is selected and said particular one of said plurality of juxtaposed rows of conductors is selected, the memory cell at that location is read giving a down level at the output of said data readout circuitry if a logic "zero" is stored in the memory cells, and giving an up level at the output thereof if a logic "one" is stored in the memory cell.

2. The crosstie random access memory system of claim 1 wherein said memory element further comprises:

a substrate;

a first level of polycrystalline magnetic material configured into a plurality of juxtaposed columns of memory cells to form an array thereof; each one of said plurality of juxtaposed columns of memory cells being configured into a wiggle pattern;

a second level of insulating material having vias for connection to each one of said plurality of juxtaposed columns of memory cells;

a third level of conducting material configured into a plurality of juxtaposed row conductors perpendicular to said plurality of juxtaposed columns of memory cells, each one of said plurality of juxtaposed row conductors being disposed above corresponding memory cells of said plurality of juxtaposed columns of memory cells;

a fourth level of insulating material having vias for connecting to each one of said plurality of juxtaposed row conductors; and a fifth level of conducting material configured into a plurality of juxtaposed column conductors which meander above corresponding columns of said array traversing each memory cell therein in the same direction.

3. The crosstie random access memory system of claim 2 wherein said substrate is glass.

4. The crosstie random access memory system of claim 2 wherein said substrate comprises a silicon oxide layer grown on a silicon substrate.

5. The crosstie random access memory system of claim 2 wherein said polycrystalline magnetic material comprises permalloy of 81-19 Ni-Fe, and wherein the thickness thereof is about 400 Å.

6. The crosstie random access memory system of claim 5 wherein the second and fourth levels of insulating material comprises silicon nitride having a thickness at each level of about 2000 Å.

7. The crosstie random access memory system of claim 6 wherein the third level of conducting material comprises 95-5 Al-Cu having a thickness of about 1000 Å.

8. The crosstie random access memory system of claim 7 wherein the fifth level of conducting material comprises 95-5 Al-Cu having a thickness of about 3000 Å.

9. The crosstie random access memory system of claim 8 comprising an additional level between the first and second levels comprising current shunts disposed on said permalloy between adjacent ones of said memory cells in a juxtaposed column thereof, said current shunts being configured to reduce the resistance of a juxtaposed column of memory cells.

10. The crosstie random access memory system of claim 9 wherein the permalloy under said current shunts is discontinuous.

11. The crosstie random access memory system of claim 10 wherein each current shunt comprises 95-5 Al-Cu having a thickness of about 1500 Å.

12. The crosstie random access memory system of claim 11 wherein said row means further comprises:

a row address decoder operatively connected at its inputs to a plurality of row address lines for selecting the particular one of the plurality of juxtaposed rows of conductors, and for producing at its output a "high" level based on the predetermined address;

a row read/write select device operatively connected to the output of said row address decoder to the enable line and to the read/write line for determining the polarities and amplitudes of the drive currents, and for operatively connecting and driving the particular one of the plurality of juxtaposed rows of conductors; and a row read/write driver operatively connected to said row read/write select device for cooperating therewith in determining the polarities and amplitudes of the drive currents, and for operatively connecting and driving the same particular one of the plurality of juxtaposed rows of conductors.

13. The crosstie random access memory system of claim 11 wherein said column means further comprises:

a column address decoder operatively connected at its inputs to a plurality of column address lines for selecting the particular one of the plurality of juxtaposed meandering columns of conductors or the particular one of the plurality of juxtaposed columns of memory cells, and for producing at its output a "high" level based on the predetermined address;

a column read/write select device operatively connected to the output of said column address decoder to the enable line, to the read/write line and to the data in line for determining the polarities and amplitudes of the drive currents, for operatively connecting and driving the particular one of the meandering columns of conductors during the write operation, and for driving the particular one of the plurality of juxtaposed columns of memory cells during the read operation; and a permalloy/meander column read/write driver operatively connected to said column read/write select device for cooperating therewith in determining the polarities and amplitudes of the drive currents, for operatively connecting and driving the particular one of the meandering columns of conductors, and for driving the particular one of the plurality of juxtaposed columns of memory cells during the write and read operations, respectively.

14. The crosstie random access memory system of claim 13 wherein the drive current in each of the particular one of the plurality of juxtaposed rows of conductors and in each of the particular one of the plurality of juxtaposed meandering columns of conductors for writing a logic "zero" is a positive polarity current of abut 15 mA.

15. The cross ties random access memory system of claim 13 wherein the drive current in each of the particular one of the plurality of juxtaposed rows of conductors and in each particular one of the plurality of juxtaposed meandering columns of conductors for writing a logic "one" is a negative polarity current of about 7 mA.

16. The crosstie random access memory system of claim 15 wherein the drive current in each of the particular one of the plurality of juxtaposed rows of conductors and in each of the particular one of the plurality of juxtaposed columns of memory cells for reading a logic "zero" or logic "one" is a positive polarity current of about 15 mA.

17. In a crosstie random access memory having memory cells arranged in columns and rows and means for magnetically storing data in the memory cells; means for controllably effecting read and write operations with respect to said data, including: address means operatively connected to the columns of the memory cells for selective location of the memory cells through which currents are conducted, means applying pulses to said rows of the memory cells for changing resistances of the selectively located memory cells through which the currents are conducted during the read operations and data readout means for producing outputs in response to said changing resistances of the memory cells dependent on the data stored therein.

18. The crosstie random access memory of claim 17 wherein the data stored in the memory cells consists of logic one and logic zero magnetic levels and said outputs of the data readout means are an increasing voltage corresponding to the logic one level and a decreasing voltage corresponding to the logic zero level of the data stored in the selectively located memory cells.

* * * * *